US006350548B1

(12) United States Patent
Leidy et al.

(10) Patent No.: US 6,350,548 B1
(45) Date of Patent: Feb. 26, 2002

(54) NESTED OVERLAY MEASUREMENT TARGET

(75) Inventors: Robert K. Leidy, Burlington; Debra L. Meunier, Westford, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/526,661

(22) Filed: Mar. 15, 2000

(51) Int. Cl.[7] .................................................. G03F 9/00
(52) U.S. Cl. ........................ 430/22; 257/797; 438/975
(58) Field of Search ...................... 430/5, 22; 257/797; 438/975

(56) References Cited

U.S. PATENT DOCUMENTS

| 5,280,437 A | 1/1994 | Corliss ........................ 364/559 |
| 5,316,984 A | 5/1994 | Leourx ........................ 437/250 |
| 5,451,479 A | 9/1995 | Ishibashi ..................... 430/22 |
| 5,532,091 A | 7/1996 | Mizutani ...................... 430/22 |
| 5,635,336 A | 6/1997 | Bae ............................. 430/314 |
| 6,063,529 A * | 5/2000 | Hwang ......................... 430/22 |

OTHER PUBLICATIONS

IBM TDB vol. 29, N.4 Sep. 1986 pp. 1617 Integrating Mask Registration and Critical Image Test Features Into Common Diagnostics to Improve Mask Product Disposition.
IBM TDB vol. 22, N. 10 Mar. 1980 pp. 4505+ Exposure Mask Diagnostic and Dispostion Targets.

* cited by examiner

Primary Examiner—Christopher G. Young
(74) Attorney, Agent, or Firm—James M. Leas; Mark F. Chadurjian

(57) ABSTRACT

A mask overlay measurement target includes nested boxes on three levels or has adjacent boxes sharing a common side, saving substantial area. The nested overlay measurement target also provides savings in measurement time since multiple overlay combinations can be measured at once. The nested target provides more level-to-level overlay information than has been available with standard box-in-box targets. The nested boxes are also used on a single level to provide area savings for stepper field placement metrology.

22 Claims, 9 Drawing Sheets

NESTED OVERLAY MEASUREMENT TARGET

FIELD OF THE INVENTION

This invention generally relates to overlay measurement targets. More particularly, it relates to overlay measurement targets for semiconductor wafers. Even more particularly, it relates to an improved target that saves room in kerf areas of a wafer.

BACKGROUND OF THE INVENTION

Semiconductor wafer fabrication involves a series of photolithographic steps to provide patterned layers of material one over another. The layers must be carefully, and precisely aligned to each other so that the final structure functions as planned. Structures are included in each layer for measuring how much that layer is out of alignment with a previously formed layer. Structures may also be provided for measuring how much a later formed layer is out of alignment with that layer. These structures are typically boxes of different size. The x and y misalignment is measured by how much a box on one level is not centered within a larger box on another level in both x and y directions.

A problem with this technique became evident with the advent of damascene wiring that is fabricating with chemical mechanical polishing. Lift off and back etch processes permitted a large area blanket metal layer to cover targets on lower levels. Thus, an overlay target could be stacked without interference from underlying targets. With damascene wiring, no large area blanket metal layer could be used so underlying targets would interfere with a stacked target. A larger amount of area in the kerf region between chips has been needed for overlay measurement targets to overcome this problem, crowding out other test structures. In addition, as the number of masks and wiring levels increases the number of overlay alignment measurement targets has increased, using up more and more area in the kerf for both standard etch and damascene processed layers. Thus, a better solution for overlay measurement targets is needed that avoids using a large amount of kerf space, and this solution is provided by the following invention.

SUMMARY OF THE INVENTION

It is therefore an object of the present invention to provide a way to reduce the area for overlay measurement targets.

It is a further object of the present invention to provide a mark on each layer of three layers that combine to provide a three level nested target for providing x or y coordinate information for the three layers relative to each other.

It is a further object of the present invention to provide marks on each layer of at least three layers in which a mark on one level includes at least two nested marks on other levels that are not nested with each other.

It is a further object of the present invention to provide nested marks for measuring stepper field placement on adjacent overlapping fields.

It is a further object of the present invention to provide a mark on one level having a plurality of boxes and marks within those boxes on two or more other layers.

It is a further object of the present invention to provide marks on each layer of at least three layers in which at least two marks are nested and two marks on one level share a common edge. The nested target provides x or y coordinate information for the three layers relative to each other.

It is a feature of this aspect of the present invention that the targets provide alignment coordinate information for at least three levels.

It is an advantage of the present invention that the nested overlay measurement targets use less space than would be required by separate overlay measurement targets for each pair of levels.

These and other objects, features, and advantages of the invention are accomplished by a multilayer structure, comprising marks on each layer of three layers, said marks combined to provide a nested overlay measurement target, said nested measurement target comprising a first mark on a first layer in a second mark on a second layer in a third mark on a third layer, said nested overlay measurement target for providing x or y coordinate information for the three layers relative to each other.

Another aspect of the invention is accomplished by a multilayer structure, comprising marks on each layer of at least three layers, said marks combined to provide a first and a second nested overlay measurement target, said first and said second nested measurement targets sharing a common edge, said first nested measurement target comprising a first mark on a first layer in a second mark on a second layer, said second nested measurement target comprising a third mark on a third layer in a fourth mark on a fourth layer, said nested overlay measurement target for providing x or y coordinate information for the three layers relative to each other.

BRIEF DESCRIPTION OF THE DRAWINGS

The foregoing and other objects, features, and advantages of the invention will be apparent from the following detailed description of the invention, as illustrated in the accompanying drawings, in which:

FIG. 8b is a top view of the larger number of measurement targets needed in the prior art to provide the same information as provided by the arrangement of FIG. 8a;

FIG. 9b is a top view of the prior art measurement targets needed to provide some of the information available from the nested measurement target of FIG. 9a.

DETAILED DESCRIPTION OF THE INVENTION

Figure 1:
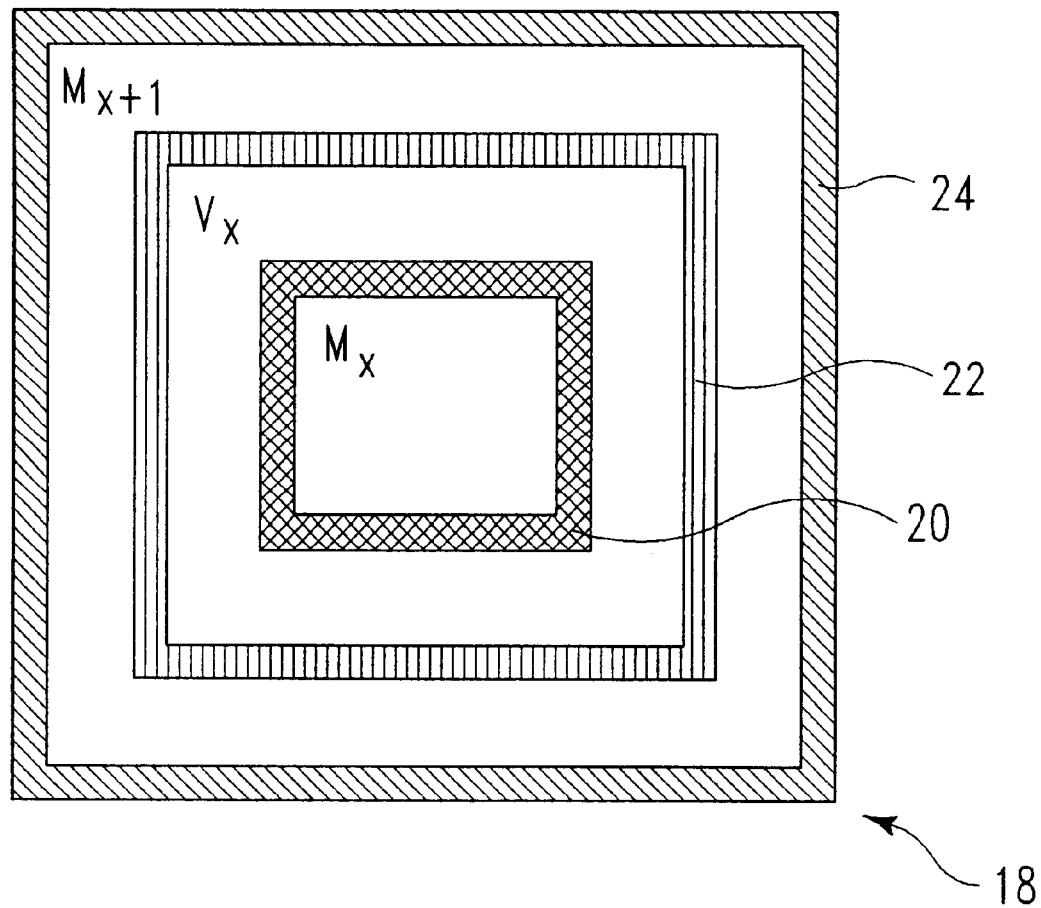
FIG. 1 is a top view of a wafer having a nested overlay measurement target of the present invention.

The present inventors discovered that overlay measurement target 18 can include more than two levels, as shown in FIG. 1. By providing nested targets formed of boxes 20, 22, and 24 substantial space can be saved. Box 20 on a first level is shown inside box 22 on a second level which in turn is inside box 24 on a third level. The mask levels can include silicon and/or metalization levels. For example the first level can be the first level of metal, M1, the second level can be the first stud level, V1, and the third level can be the second level of metal, M2.

A standard overlay target design uses a 13×13 um inner box and a 26×26 um outer box. The present inventors found that they could provide two boxes nested inside a 28×28 um box, effectively providing the information that required two standard 26×26 um boxes in one slightly larger target. Thus, the new target nearly halves the space for alignment metrology.

Figure 2A:
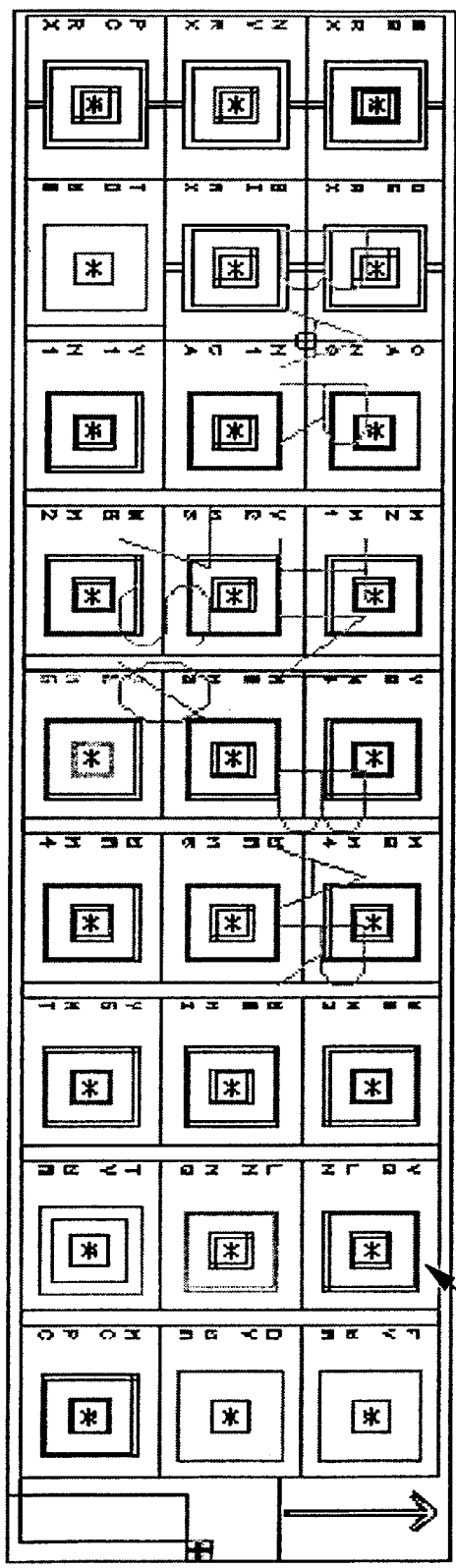
FIG. 2a is a top view of a wafer having standard overlay measurement targets of the prior art.
Figure 2B:
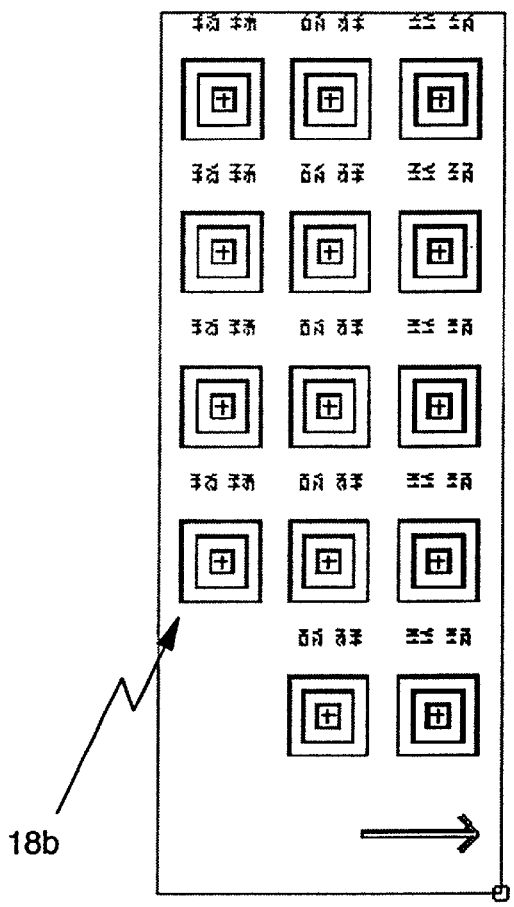
FIG. 2b is a top view of a wafer having nested overlay measurement targets of the present invention showing a substantial savings in area.

The space savings possible for a complete set of mask levels is shown in FIGS. 2a and 2b. The 36 standard two-level measurement targets 18a that were needed to provide for the needed measurements, shown in FIG. 2a, could be replaced by 14 three level measurement targets 18b shown in FIG. 2b, again saving about half the space.

Figure 3A:
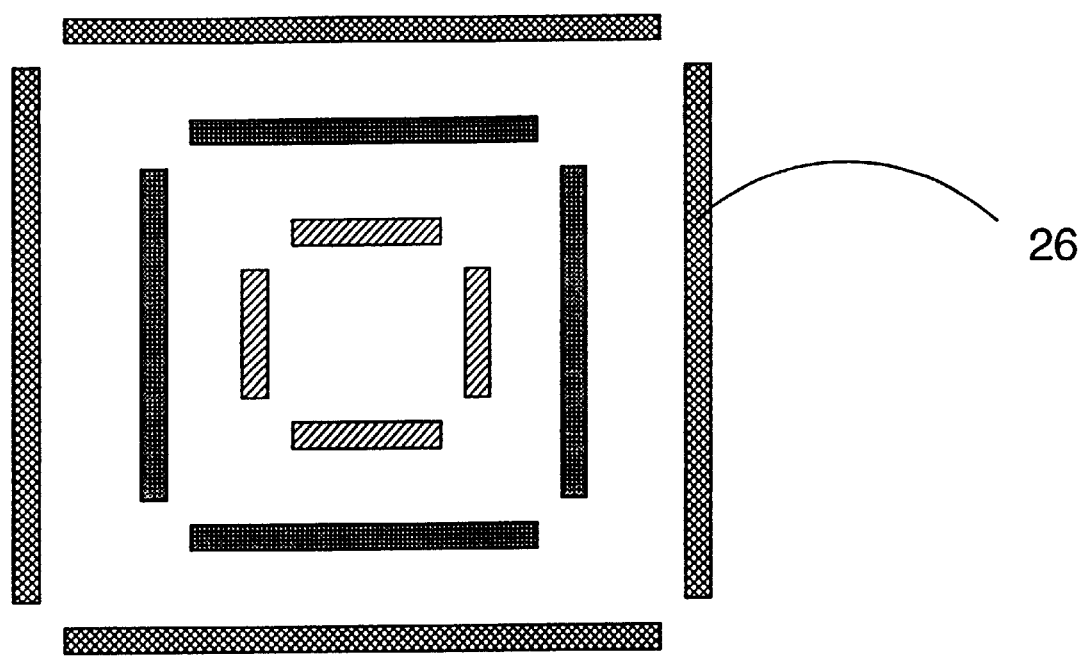
FIG. 3a is an alternate embodiment of the nested overlay measurement target of FIG. 1 with all boxes having bars instead of solid sides.
Figure 3B:
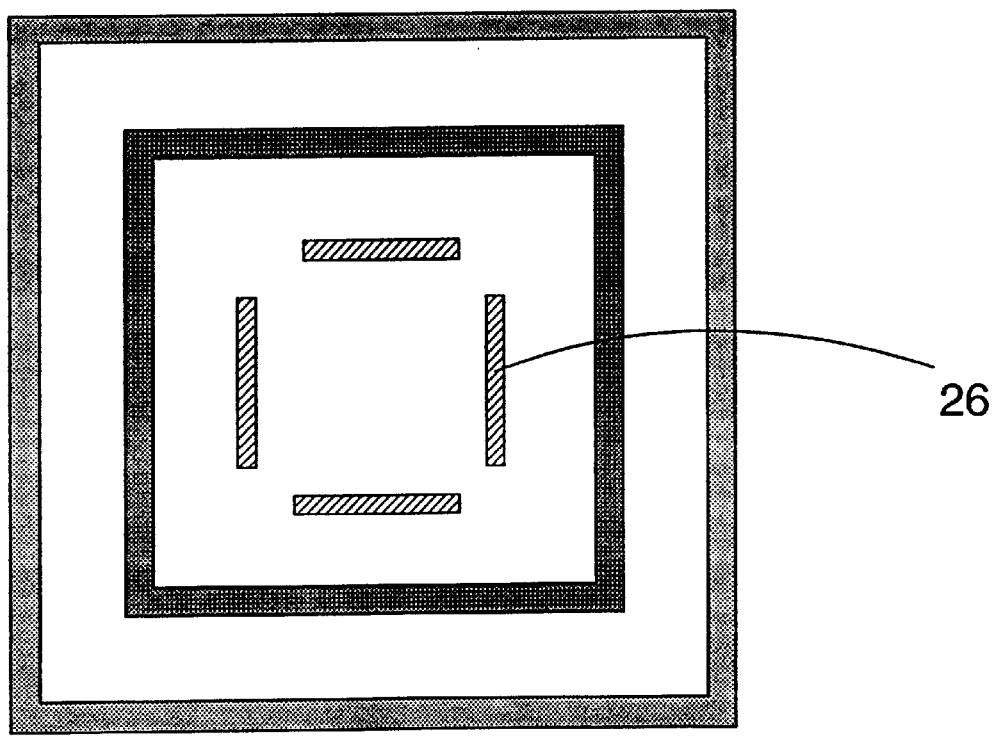
FIG. 3b is an alternate embodiment of the nested overlay measurement target of FIG. 1 with one box having bar sides instead of solid sides.

Boxes 20, 22, 24 of target 18 need not be complete; bars 26 can replace full sides, as shown in FIG. 3a or FIG. 3b. A box can be larger or smaller than a box on a lower level.

Figure 4:
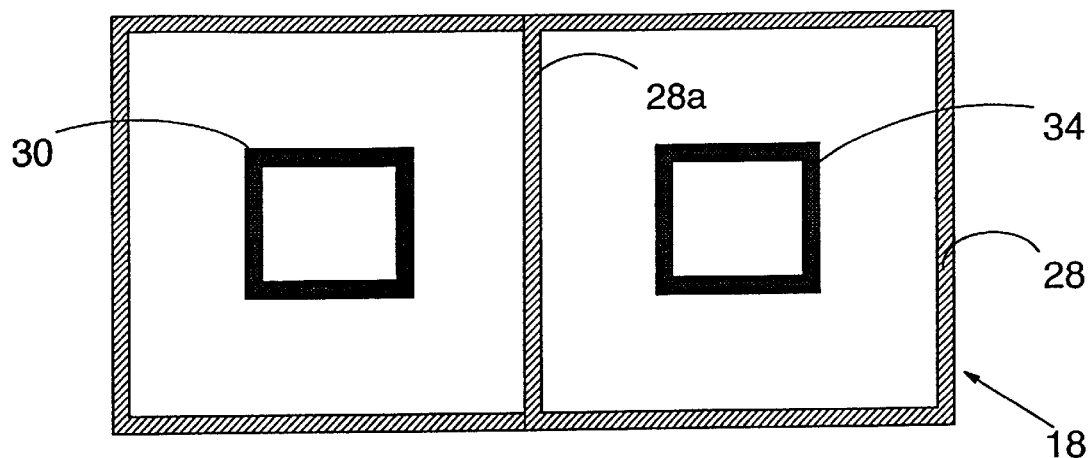
FIG. 4 is an alternate embodiment of the present invention in which adjacent overlay measurement targets share a common side.
Figure 5:
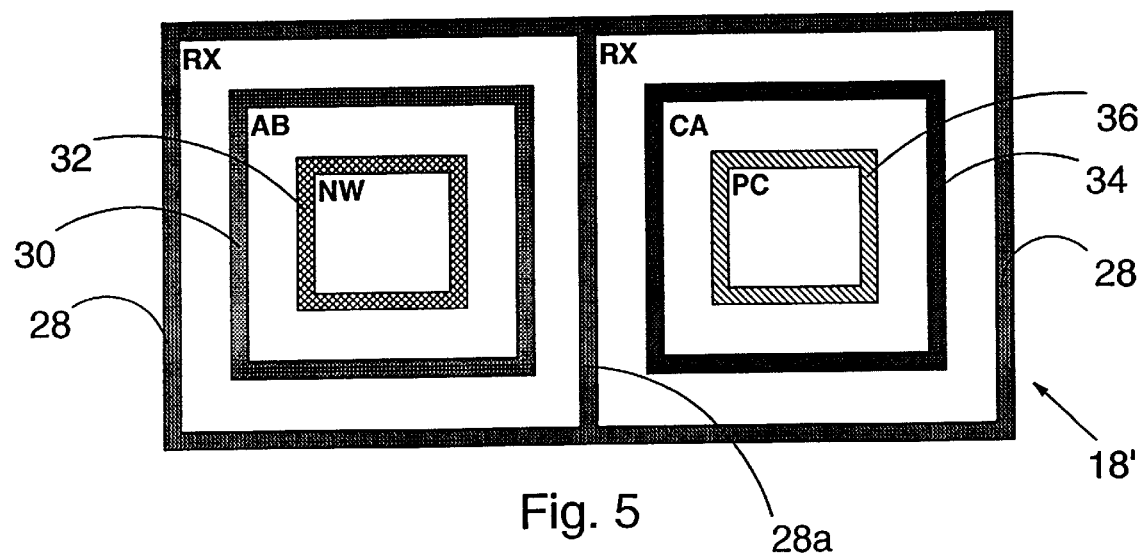
FIG. 5 is an alternate embodiment of the overlay measurement target of FIG. 4 with nested boxes.

An alternate scheme to the fully nested targets for measuring misalignment of two levels to a third reference level is shown in FIG. 4. A scheme to measure misalignment among five levels is shown in FIG. 5 in which marks on four of the levels can all be measured to a mark on a fifth level. A connected box mark is used on the reference level. This scheme is particularly useful for conserving space while measuring a number of levels referenced to a single level. In FIG. 5, the alignment of marks 30, 32, 34, and 36 on four different levels can all be measured with reference to mark 28 on a fifth level. Mark 28 can be considered to have side 28a that is shared by two adjacent overlay measurement targets. In addition to referencing mark 28, the alignment of level 30 to level 32 and of level 34 to level 36 can also be measured in this compact structure. Such a structure may be used for measuring misalignment to a single level, such as the very first mask used in the process in the silicon level. For example, level 28 may be the Rx mask, which is the first masking level at IBM. Levels 30 and 32 may be the next two levels above Rx, which may be designated AB and NW. Levels 34 and 36 may be the next two levels above NW, which may be designated CA and PC.

Figure 6A:
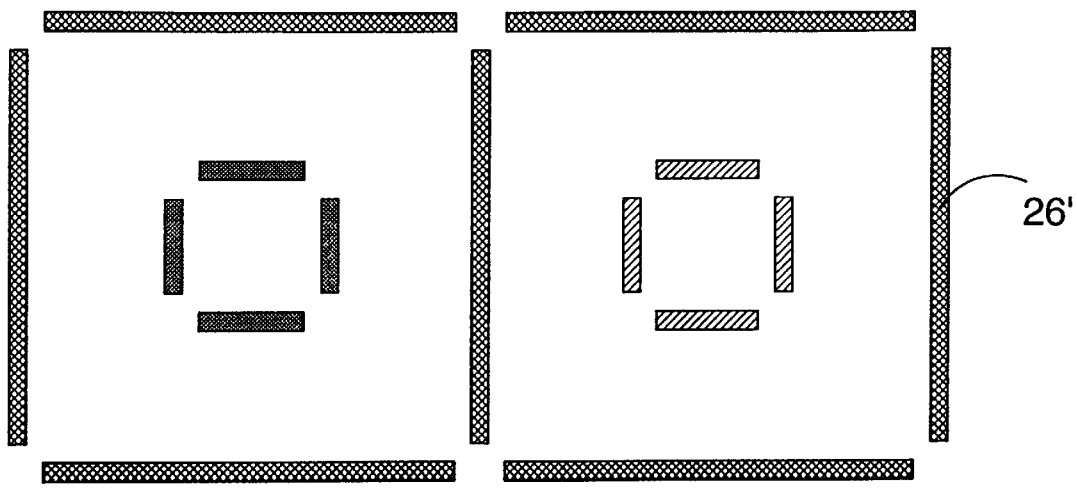
FIG. 6a is an alternate embodiment of the overlay measurement target of FIG. 4 with boxes having bars instead of solid sides.
Figure 6B:
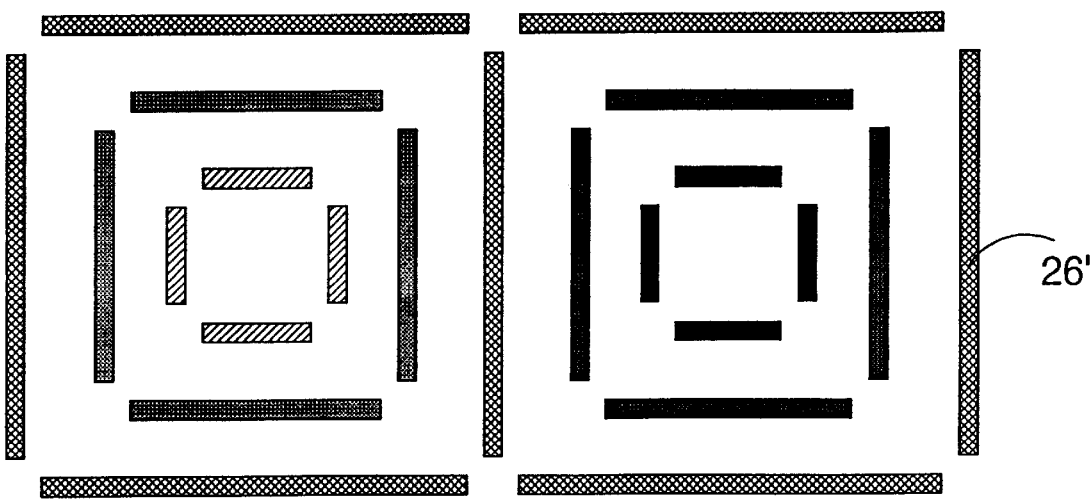
FIG. 6b is an alternate embodiment of the overlay measurement target of FIG. 5 with nested boxes.
Figure 7:
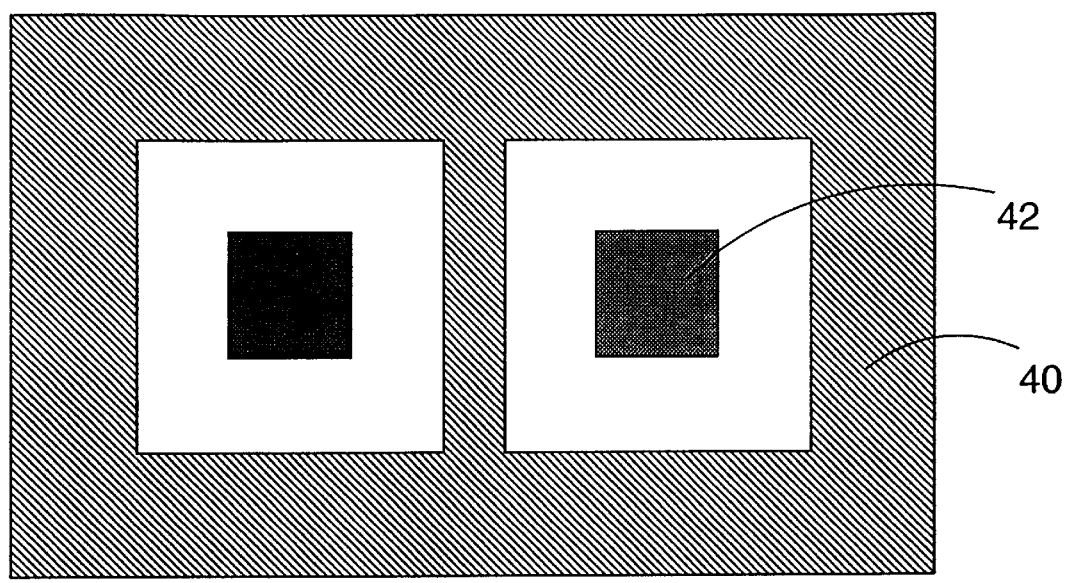
FIG. 7 is an alternate embodiment of the overlay measurement target of FIG. 4 in which each box covers a wide area.

As in FIGS. 3a and 3b, boxes 28,30,32,34, and 36 need not be complete; bars 26' can be used as shown in FIGS. 6a or 6b. Boxes can also have wide sides 40, and center box 42 can cover the entire area within, as shown in FIG. 7.

Figure 8A:
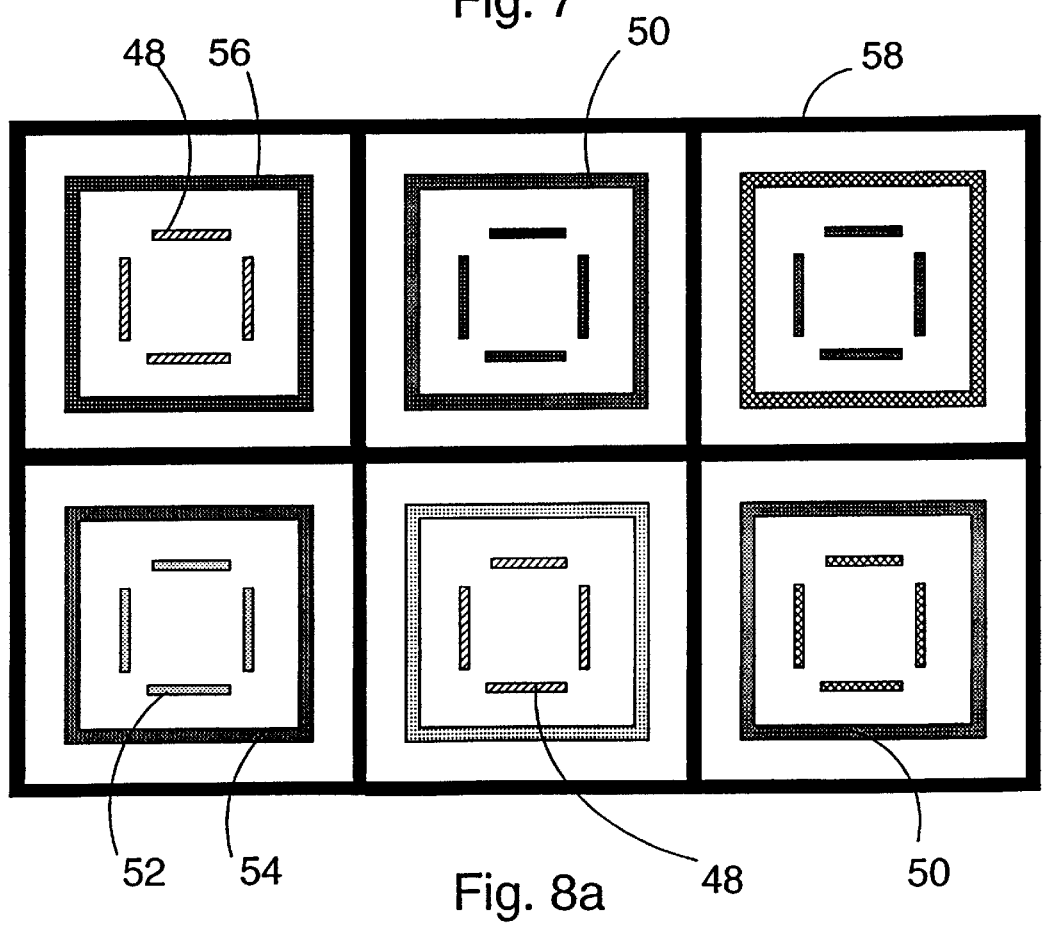
FIG. 8a is a top view of an extension of the invention shown in FIG. 5 to include an array of measurement targets sharing common sides and referencing a single layer.
Figure 8B:
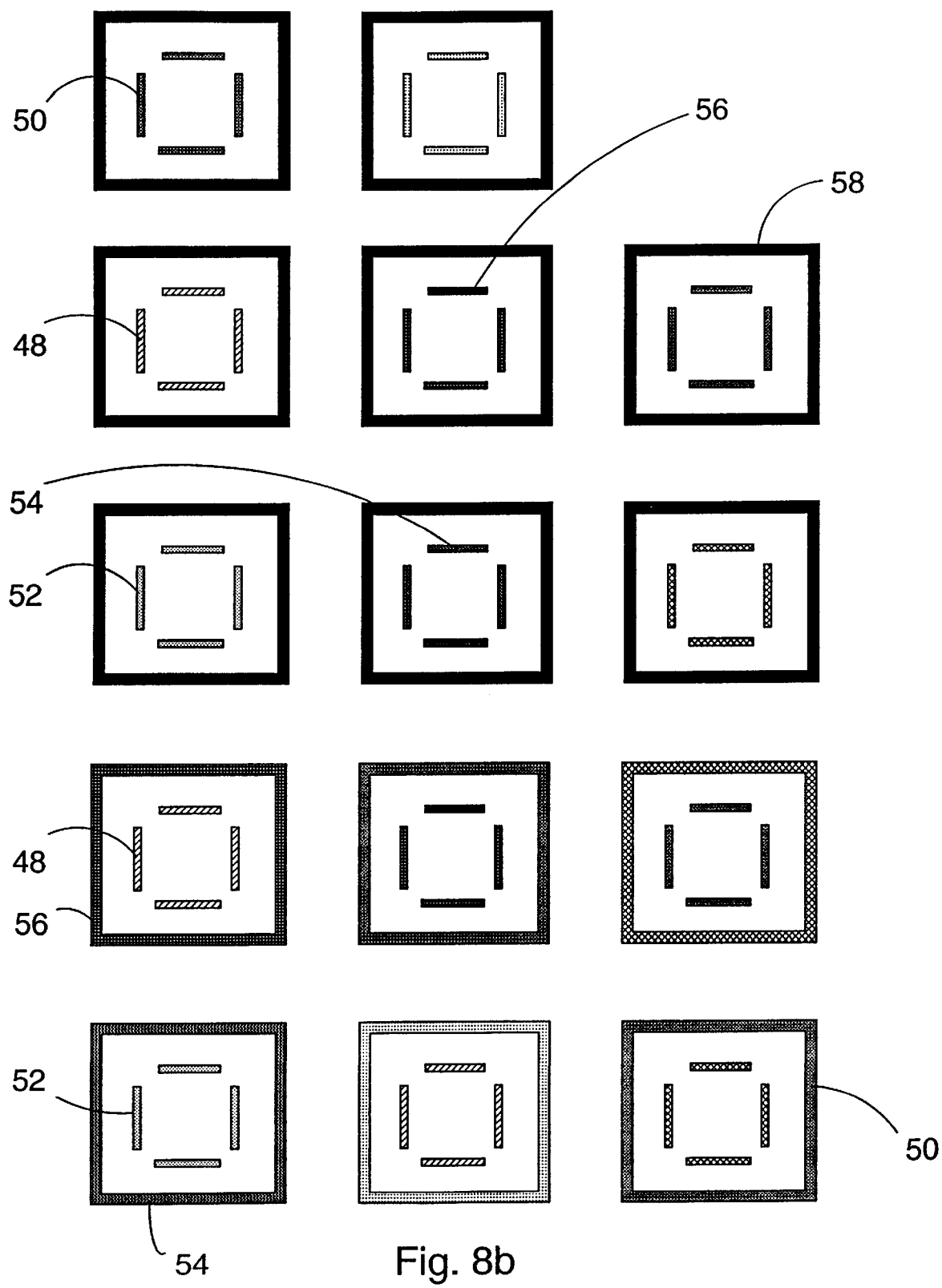

The common side idea of FIGS. 4, 5, 6a, 6b and 7 can be extended to provide a large number of levels 48, 50, 52, 54, 56 all referenced to a single mask level 58, as shown in FIG. 8a. Substantial savings in area are obtained with this arrangement as compared with the prior art that provides alignment measurement for as many levels shown in FIG. 8b. The same information is provided by FIGS. 8a and 8b but the layout of FIG. 8a is much more compact because of nesting and sharing one to four common sides reduces the number of separate targets needed.

Figure 9A:
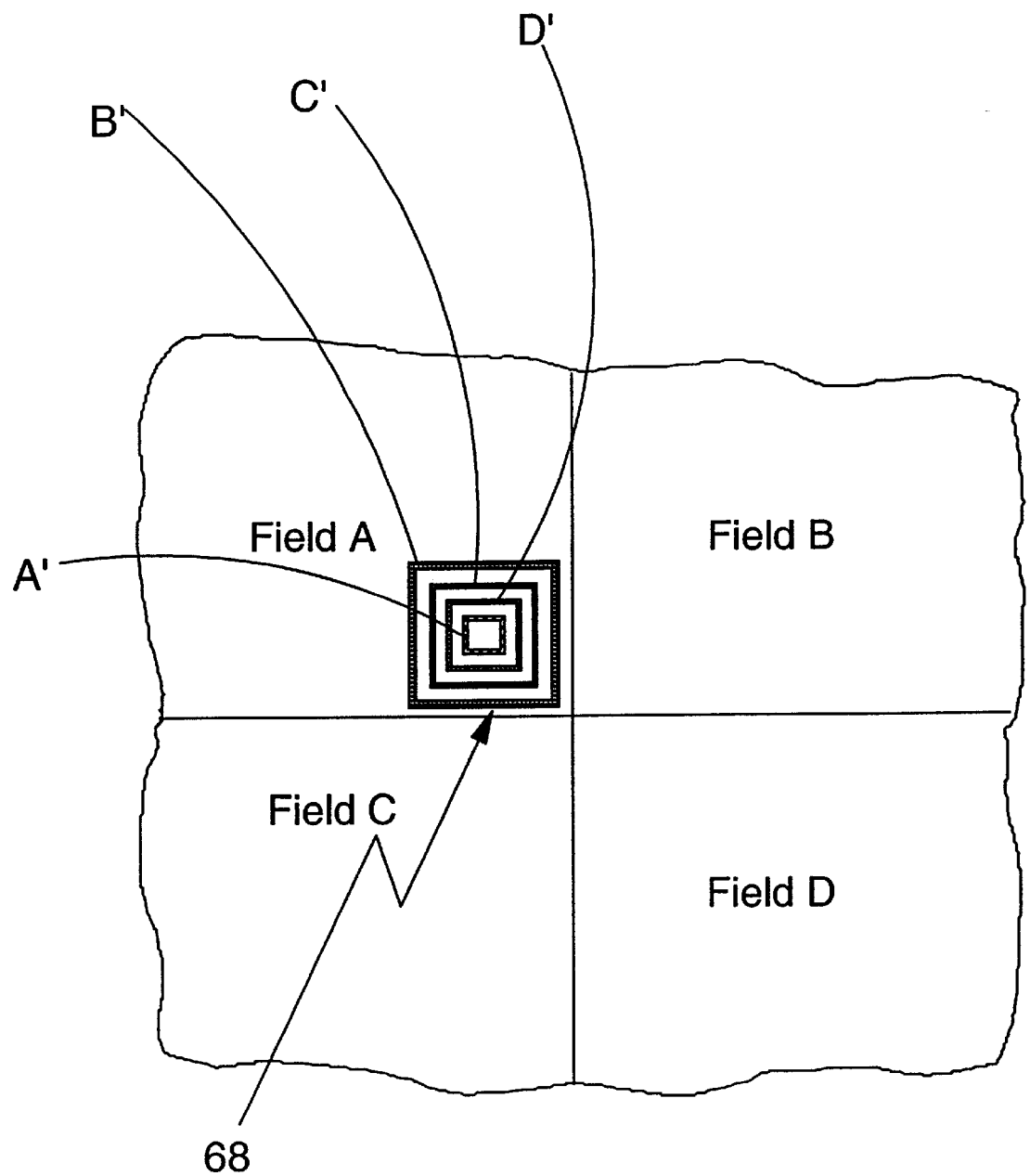
FIG. 9a is a top view of a nested measurement target for measuring adjacent stepper field placement.
Figure 9B:
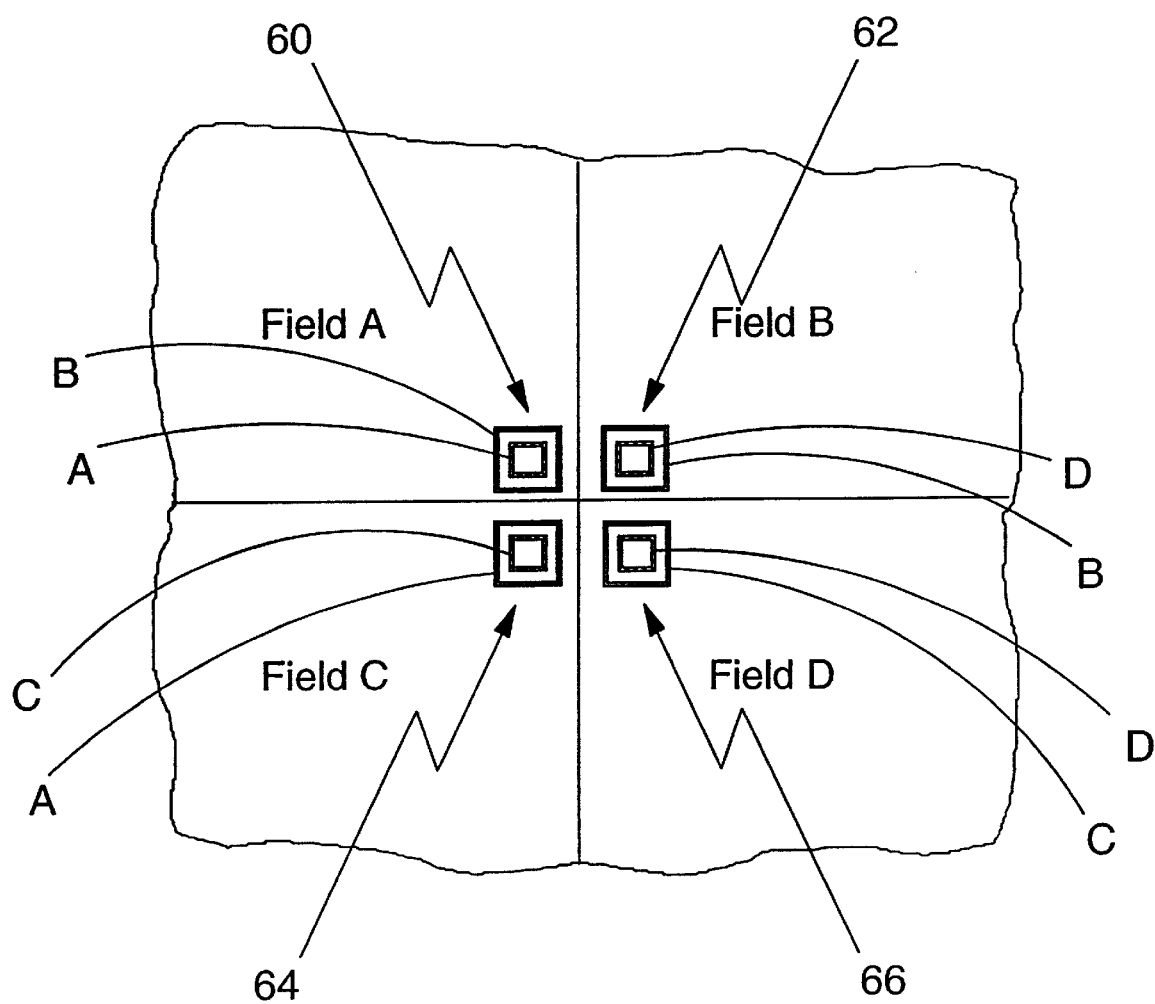

Nesting also permits area savings for measuring first level field placement as shown in FIG. 9a. The measurement is to ensure that adjacent stepper fields were placed as desired to avoid magnification and rotation errors in stepping from one field to the next field. Substantial savings in area are obtained with this arrangement as compared with the prior art that provides first level field placement information shown in FIG. 9b. The same information is provided by FIGS. 9a and 9b but the layout of FIG. 9a is much more compact because of nesting. Conventionally, targets 60, 62, 64, and 66 are located in fields A, B, C, and D, as shown in FIG. 9b. Target 60 includes box A in box B; target 62 includes box B in box D; target 64 includes box C in box A; and target 66 includes box D in box C. Thus, four separate targets are needed to provide information for the four fields relative to each other. In the nested target of the present invention, target 68 includes box A' in box B' in box C' in box D', as shown in FIG. 9a. Any variation in magnification or rotation that could be observed in the four targets of FIG. 9b can be seen in the single target of FIG. 9a. In addition there are four additional pieces of information corresponding to the placement of diagonal fields. The invention takes advantage of the fact that adjacent stepper fields overlap so the four marks can be provided in one target.

The present invention provides advantage in addition to saving space; it provides more level to level data and it also can save time since the various overlay combinations can all be measured in a single measurement. For example, in FIG. 1, M2 to M1, M2 to V1, and M1 to V1 can all be measured in one measurement scan. Three targets would have been needed in the standard box-in-box scheme to provide the same amount of data, and the measurement would have taken three times the time. The invention is applicable to standard metallization, damascene, and dual damascene technology for silicon, implant, gate, isolation, metalization, and insulation levels.

While several embodiments of the invention, together with modifications thereof, have been described in detail herein and illustrated in the accompanying drawings, it will be evident that various further modifications in the design of the combined mark are possible without departing from the scope of the invention. For example, more than three boxes can be nested in FIGS. 1 and 5. Nothing in the above specification is intended to limit the invention more narrowly than the appended claims. The examples given are intended only to be illustrative rather than exclusive.

What is claimed is:

1. A semiconductor structure, comprising a plurality of marks, said marks combined to provide a nested measurement target, said nested measurement target comprising a first mark on a first layer within a second mark on a second layer within a third mark on a third layer, wherein said first mark does not overlap said second mark and said second mark does not overlap said third mark, said nested measurement target for providing x or y coordinate information for the three marks relative to each other.

2. The semiconductor structure of claim 1, wherein the nested measurement target is located in space between semiconductor chips on a semiconductor wafer.

3. The semiconductor structure of claim 1, wherein said first mark comprises a first box, said second mark comprises a second box, and said third mark comprises a third box.

4. The semiconductor structure of claim 3, wherein each said box comprises a line.

5. The semiconductor structure of claim 3, wherein said first box comprises an area.

6. The semiconductor structure of claim 1, wherein said first layer is above said second layer and wherein said second layer is above said third layer.

7. The semiconductor structure of claim 1, wherein said first layer is above said third layer and wherein said third layer is above said second layer.

8. The semiconductor structure of claim 1, wherein said first mark comprises a first pair of lines along an x direction and a second pair of lines along a y direction.

9. The semiconductor structure of claim 1, wherein said second mark comprises a third pair of lines along an x direction and a fourth pair of lines along a y direction wherein said first pair of lines is within said third pair of lines and wherein said second pair of lines is within said fourth pair of lines.

10. A semiconductor structure, comprising marks on each layer of at least three layers, said marks combined to provide a first and a second nested measurement target, said first nested measurement target comprising a first mark on a first layer within a second mark on a second layer, said second nested measurement target comprising a third mark on a third layer within a fourth mark on said second layer, said second mark and said fourth mark sharing a common line, said nested measurement target for providing x or y coordinate information for said three layers relative to each other.

11. The semiconductor structure of claim 10, wherein the marks are located in space between semiconductor chips on a semiconductor wafer.

12. The semiconductor structure of claim 10, wherein said first mark comprises a first box, said third mark comprises a second box.

13. The semiconductor structure of claim 12, wherein each said box comprises a line.

14. The semiconductor structure of claim 12, wherein said first box and said third box comprise areas.

15. The semiconductor structure of claim 10, wherein said second mark and said fourth mark comprise a box next to a box.

16. The semiconductor structure of claim 10, wherein said first mark comprises a pair of lines along an x direction and a pair of lines along a y direction.

17. The semiconductor structure of claim 10, wherein said nested measurement target is for providing both x and y coordinate information.

18. The semiconductor structure of claim 10, further comprising a fifth mark within said first mark.

19. The semiconductor structure of claim 10, further comprising a sixth mark within said third mark.

20. The semiconductor structure of claim 10, further comprising a seventh mark on said second level, wherein said seventh mark shares a line with said second mark.

21. The semiconductor structure of claim 20, wherein said second mark shares a first common line with said fourth mark and said second mark shares a second common line with said seventh mark.

22. The semiconductor structure of claim 10, further comprising an array of measurement targets sharing common sides.

* * * * *